United States Patent
Godbee et al.

(10) Patent No.: US 6,459,313 B1
(45) Date of Patent: *Oct. 1, 2002

(54) IO POWER MANAGEMENT: SYNCHRONOUSLY REGULATED OUTPUT SKEW

(75) Inventors: Joy F. Godbee; Coralyn S. Gauvin; Paul J. Smith, all of Colorado Springs, CO (US)

(73) Assignee: LSI Logic Corporation, Milpitas, CA (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/157,214

(22) Filed: Sep. 18, 1998

(51) Int. Cl.[7] ................................................. H03L 7/00
(52) U.S. Cl. ......................... 327/161; 327/163; 327/258
(58) Field of Search ........................ 327/141, 161–163, 327/258, 259, 291, 295, 296

(56) References Cited

U.S. PATENT DOCUMENTS

| | | | | |
|---|---|---|---|---|
| 4,039,960 A | * | 8/1977 | Clark | 327/163 |
| 4,802,127 A | | 1/1989 | Akaogi et al. | 365/189 |
| 4,857,765 A | | 8/1989 | Cahill et al. | 326/26 |
| 4,949,361 A | * | 8/1990 | Jackson | 327/162 |
| 5,004,933 A | * | 4/1991 | Widener | 327/144 |
| 5,059,822 A | | 10/1991 | Dukes | 326/86 |
| 5,124,579 A | | 6/1992 | Naghshineh | 326/27 |
| 5,140,194 A | | 8/1992 | Okitaka | 326/86 |
| 5,150,364 A | * | 9/1992 | Negus | 370/542 |
| 5,160,922 A | | 11/1992 | DeRosa et al. | 340/825.5 |
| 5,194,764 A | | 3/1993 | Yano et al. | 326/86 |
| 5,291,588 A | * | 3/1994 | Kohtz et al. | 395/550 |
| 5,313,501 A | * | 5/1994 | Thacker | 327/161 |
| 5,389,826 A | * | 2/1995 | Sonobe | 327/141 |
| 5,412,698 A | * | 5/1995 | Van Brundt et al. | 327/141 |
| 5,596,284 A | | 1/1997 | Wykes et al. | 326/27 |
| 5,632,019 A | | 5/1997 | Masiewicz | 395/250 |

FOREIGN PATENT DOCUMENTS

JP 60-263518 * 12/1985 ................. 327/163

OTHER PUBLICATIONS

Webster's II New Riverside University Dictionary, Copyright 1994, p. 126.*

* cited by examiner

*Primary Examiner*—Kenneth B. Wells
(74) *Attorney, Agent, or Firm*—Carstens, Yee & Cahoon LLP

(57) ABSTRACT

An integrated circuit device with reduced noise is described. In traditional simultaneous output switching integrated circuits the noise is proportional to the number of concurrently switching outputs. This excessive supply noise can cause the integrated circuit to malfunction through the loss of data. In the present invention, switching supply noise is reduced in the device without increasing the number of input-output pins by synchronously skewing the output driver. In a preferred embodiment, flip-flops are used to control the phase of the switching outputs in order to reduce the noise and instantaneous power by the number of phase assignments.

20 Claims, 3 Drawing Sheets

US 6,459,313 B1

IO POWER MANAGEMENT: SYNCHRONOUSLY REGULATED OUTPUT SKEW

BACKGROUND OF THE INVENTION

1. Technical Field

The invention relates to an improved semiconductor integrated circuit. More specifically, the invention relates to the output stage of a semiconductor integrated circuit. Still more specifically, the invention relates to a semiconductor integrated circuit output stage with improved noise characteristics. Still more specifically, the invention relates to the phased driving of different channels of a parallel data bus.

2. Description of Related Art

Digital logic circuits and digital data transmission circuits are widely used in the areas of electronics, computer, and telecommunications equipment and peripherals. For example and without limitation, it is well known in the art that a computer is made up of individual integrated circuit chips connected together on a printed circuit board. Data flows between the individual integrated circuits as part of the inherent functioning of the computer. If this data is corrupted by noise, then the computer will malfunction. Similarly, a microcontroller circuit for driving a stepping motor or other electro-mechanical system will also often be made up of a number of integrated circuit chips connected by data busses. Driving data down these busses can be a source of noise if care is not taken to minimize the transient power.

A common trend across the field of digital electronics is an increase in the data flow, both in terms of clock rate and in terms of volume of data per clock cycle. This trend gives rise to several design challenges, including an increase in the number and density of in/out connections. Valuable silicon area can be wasted if too much space is devoted to connectivity. Another design challenge associated with higher clock frequencies is the trend towards increased radiation, where power leaves the signal line and becomes background noise.

Currently, integrated circuit packages contain numerous output driving pins which all simultaneously fire on a single clock edge. Referring to FIG. 1 a known N-pad output stage for a simultaneously switching output driver of a digital circuit is shown. N output digital signal lines 101 are connected to N flip-flops 102 whose clocks 103 are connected to a write-clock signal 104. The write-clock signal simultaneously triggers the array of N flip-flops 102. The outputs of the flip-flops are connected to buffers 105 that are connected to input/output pads 106. The output signals are latched by the flip-flop circuitry, which may be, but are not limited to, type D flip-flops. It should be noted, however, that, as is well known in the art, type D flip-flops fire the output upon the enable clock stroke. In this way synchronicity is maintained and clock race problems are reduced. Thus the enable signal triggers the output signals through the gates. The buffers act to amplify the power of the output signal in order to drive a transmission line, load or multiple loads. The write-clock signal enables each of the flip-flops simultaneously, in a synchronous manner. This signal sends the output data to the buffers, and thus to the parallel data bus at the same instant in time.

Associated with this synchronous firing is a deleterious amount of conductive, inductive and radiative electrical noise. As the number of output driving pins grows, so does the level of this noise. This excessive supply noise can and will cause the integrated circuit devices to malfunction in several ways. Loss of data, bad input levels and bad output signaling are among the many failure mechanisms aggravated by supply noise. Therefore it would be advantageous to have an improved integrated circuit output driver with improved noise characteristics, with lower peak powers, lower power consumption and with an efficient use of chip area which reduces the number of output pads.

SUMMARY OF THE INVENTION

The present invention overcomes the foregoing problems and allows for an improved flow of output data signals with low noise, low power consumption, and efficient use of the number of pads.

Improved performance is accomplished by routing the data down a parallel data bus in a definitely skewed manner, so that the N lines of a data bus are each driven at different phases of a clock cycle. For example, the data is held in a parallel array of flip-flops which leads to a parallel data bus. These flip-flops are triggered, or enabled, in a synchronously skewed manner by clocking signals that arrive at the flip-flops in a staggered manner. These clocking signals could be derived from a high frequency internal clock whose toggle rate is some multiple of the maximum output toggle rate. This invention has application in microcontrollers and in other communication and power applications.

BRIEF DESCRIPTION OF THE DRAWINGS

The present invention and its features and advantages, herein described or otherwise apparent, may be better understood by reference to the following description in conjunction with the appended drawings, which drawings form a part of this specification. It is noted, however, that the appended drawings illustrate only exemplary embodiments of the invention and are therefore not to be considered limiting of its scope.

DETAILED DESCRIPTION OF THE DRAWINGS

Figure 1:
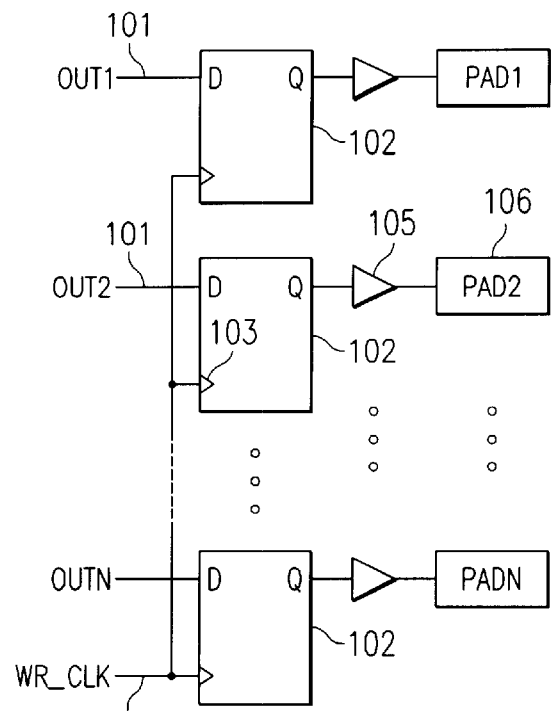
FIG. 1 is a schematic circuit diagram of a known output stage of a digital circuit, according to the prior art.
Figure 2:
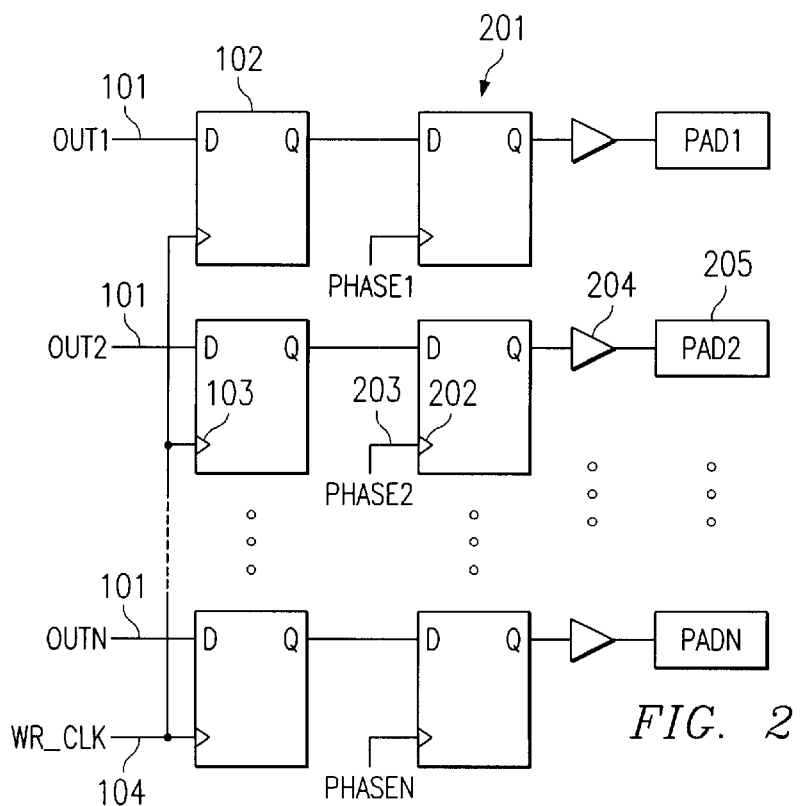
FIG. 2 is a schematic circuit diagram of the output stage of a synchronously regulated output skew circuit in a preferred embodiment of this invention.
Figure 5:
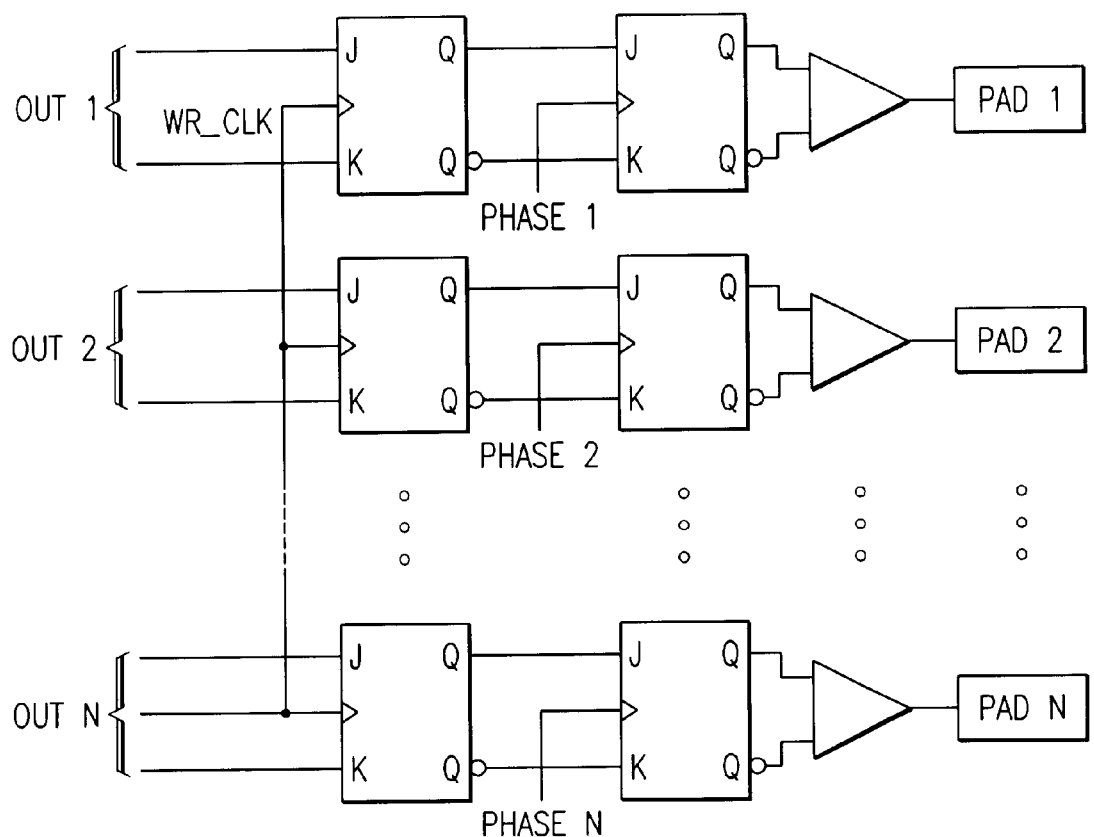
FIG. 5 is an exemplary schematic circuit diagram of the output stage of a synchronously regulated output skew circuit in a another preferred embodiment of this invention.

By example, without limitation, FIG. 2 shows a schematic circuit diagram of the output stage of a synchronously regulated output skew circuit in a preferred embodiment of this invention. The design begins with the N output digital signal lines 101 connected to N flip-flops 102, whose enables 103 are connected to a write-clock signal 104 as is known in the prior art. The write-clock signal simultaneously triggers the output data array of N flip-flops 102. Novel to this invention, the outputs of the first buffer flip-flops are connected to the inputs of a second array of N flip-flops 201. The enables 202 of the second array of N flip-flops are connected to synchronously skewed, phased clock signals 203. The outputs of the flip-flops are connected to buffers 204 that are connected to output pads 205. In a preferred embodiment, the flip-flops are type D flip-flops that fire the output on a rising edge of the clock pin. It is important to understand that the D-flip-flops are merely one option. The output data array could comprise J-K flip-flops or latches such as shown, for example, in FIG. 5. Thus if the enables are triggered in a synchronously skewed, phased manner, then the outputs of the second set of flip-flops will output the circuit in a synchronously skewed, phased manner. In this manner, the peak power, and therefore the level of conductive, inductive and radiative electrical noise is reduced by the number of data bus line channels, N.

Although the figure shows the special case where each flip-flop is assigned a trigger signal with a unique phase, a group of flip-flops may be fired at phase 1, while a second group of flip-flops may be fired at phase 2, etc. In this embodiment, the noise reduction will not be as great as in the previous embodiment, however, the data flow down the bus will be higher.

Figure 3:
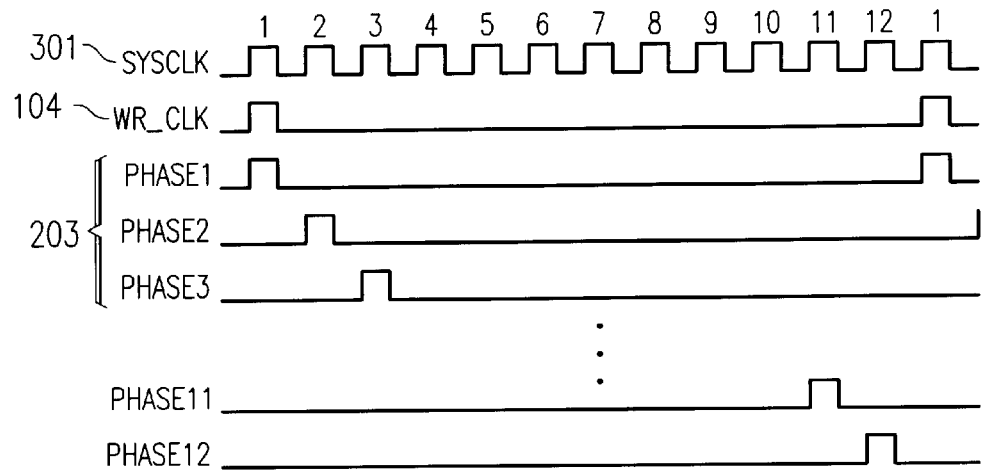
FIG. 3 is a timing diagram of the signals in an N=12 phase synchronously regulated output skew circuit.

To further illustrate a preferred embodiment, FIG. 3 shows a timing diagram for an N=12 phase synchronously regulated output skew circuit. Shown is the temporal relationship between the write-clock signal 104 the phase signals 203 and the system clock 301. In one preferred embodiment, the system clock is an internal clock, which may be applied in a microcontroller application. In another preferred embodiment the system clock may be associated with a clock external to the integrated circuit, as may be applied in a communications application. The system clock is used to create the write-clock signal using shift registers or flip-flips, as is well known in the art of digital electronics. The write-clock signal may be used to generate the individual phase signals using gate delay circuitry. The number of phase signals N may correspond to the number of data bus lines, and in general may be less than or equal to the number of clock cycles between write-clock pulses.

Figure 4:
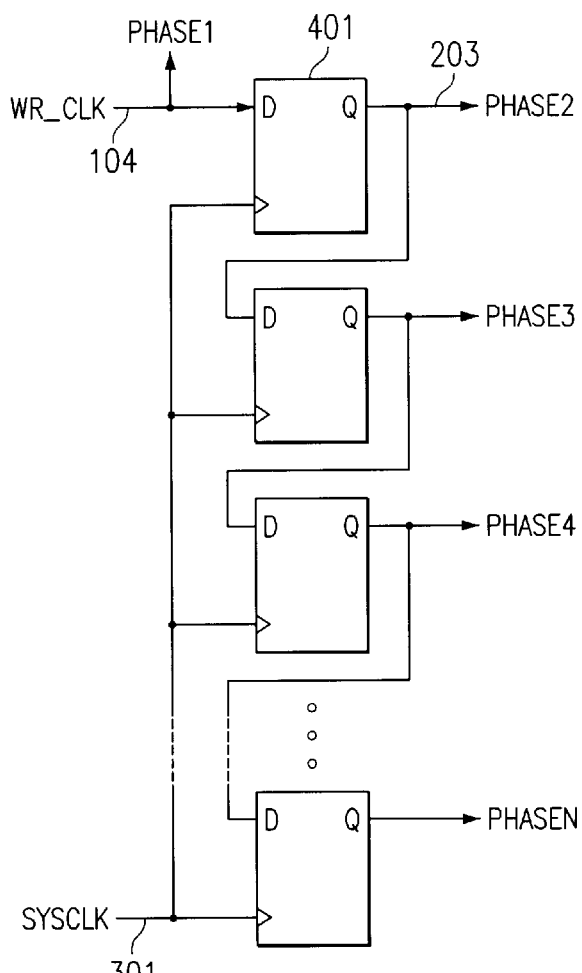
FIG. 4 is a block diagram of a timing circuit that will synchronously skew the clock and provide for N signal.

To further illustrate the generation of the timing signals, FIG. 4 shows the shift register circuitry that generates the phase signals. The write-clock signal 104 is connected to the input of a series connection of flip flops, 401. The system clock signal 301 is connected in parallel to each of the enables of the flip-flops. The outputs of the flip-flops are the N phase signals 203. Functionally, the flip-flops act to hold the write-clock signal at a specified gate until the next system clock stroke triggers the bit to move to the next gate.

Further modifications and alternative embodiments of this invention will be apparent to those skilled in the art in view of this description. Accordingly, this description is to be construed as illustrative only and is for the purpose of teaching those skilled in the art the manner of carrying out the invention. It is to be understood that the forms of the invention herein shown and described are to be taken as the presently preferred embodiments. Various changes may be made in the shape, size and arrangement of parts. For example, equivalent elements or materials may be substituted for those illustrated and described herein, and certain features of the invention may be utilized independently of the use of other features, all as would be apparent to one skilled in the art after having the benefit of this description of the invention.

We claim:

1. A synchronously regulated output skew circuit comprising an output data array coupled to an array of gates, an output of each element in the output data array being coupled to a corresponding input of a gate in the array of gates, wherein gates in the array of gates are triggered in a phased manner with respect to one another, and wherein the output data array is comprised of a simultaneously enabled array of elements.

2. The circuit of claim 1 wherein the the output data array comprises type D flip-flops.

3. The circuit of claim 1 wherein said output data array comprises an array of latches.

4. The circuit of claim 1 wherein said output data array comprises J-K flip-flops.

5. A synchronously regulated output skew circuit comprising:
   an array of gates;
   an output data array coupled to the array of gates; and
   an array of output pads coupled to the array of gates, wherein gates in the array of gates are triggered in a phased manner with respect to one another, and wherein the output data array is simultaneously enabled, and wherein outputs from said output data array are coupled to corresponding inputs of gates in the array of gates such that output from the array of gates to the output pads of the bus is skewed.

6. The circuit of claim 5, wherein said gates triggered in a phased manner are comprised of an array of type D flip-flops.

7. A driving circuit for a parallel data bus comprising:
   a first array of triggerable gates, the first array of triggerable gates being simultaneously triggered; and
   a second array of triggerable gates to store data connected to the parallel bus, wherein a phased clock signal triggers gates in said second array of triggerable gates in a phased manner with respect to one another, and wherein an output of each gate in the first array of triggerable gates is coupled to an input of a corresponding gate in the second array of triggerable gates.

8. The driving circuit of claim 7 where the phased clock signal triggers each triggerable gate of the second array of triggerable gates sequentially.

9. The driving circuit of claim 7, where the phased clock signal triggers a subset of triggerable gates of the second array of triggerable gates sequentially.

10. The driving circuit of claim 7 where the phased clock signal is a sequentially delayed internal write-clock signal.

11. A driving circuit for a parallel data bus comprising:
   a first array of triggerable gates, the first array of triggerable gates being simultaneously triggered; and
   a second array of triggerable gates to store data connected to the parallel bus, wherein a phased clock signal triggers gates in said second array of triggerable gates in a phased manner with respect to one another, and wherein an output of the second array of triggerable gates is skewed such that noise in the output of the second array of triggerable gates is reduced.

12. The driving circuit of claim 11 wherein the second array is comprised of type D flip-flops.

13. A method of flowing a plurality of output data signals within a circuit, comprising:
   (a) connecting an array of output signal lines to a first array of flip-flops;
   (b) connecting an enable input for each of said first array of flip-flops to a write clock signal line;
   (c) simultaneously triggering the first plurality of flip-flops;
   (d) connecting the outputs from said first array of flip-flops to the inputs of a second array of flip-flops; and
   (e) connecting an enable input for each of the second array of flip-flops to a synchronously skewed, phased clock signal, wherein the synchronously skewed, phased clock signal triggers flip-flops in the second array of flip-flops in a phased manner with respect to one another.

14. The method of claim 13 further comprising:
   (f) connecting an output from the second array of flip-flops to plurality of buffers.

15. The method of claim 13 wherein step (a) comprises connecting an array of output signal lines to a first array of type D flip-flops.

16. The method of claim 13 wherein step (a) comprises connecting an array of output signal lines to a first array of J-K flip-flops.

17. A circuit comprising:
   a first plurality of gates triggered in a synchronous manner;
   a second plurality of gates coupled to the first plurality of gates, the second plurality of gates being triggered in a phased manner with respect to one another, an output of each gate in the first plurality of gates being coupled to an input of a corresponding gate in the second plurality of gates; and
   a plurality of buffers coupled to the second plurality of gates.

18. A driver circuit of a bus, comprising:
   a first plurality of gates triggered in a synchronous manner; and
   a second plurality of gates coupled to the first plurality of gates, the second plurality of gates being triggered in a phased manner with respect to one another such that an output of the second plurality of gates is skewed to thereby reduce noise in data transmission signals from the bus.

19. The circuit of claim 18, wherein the second plurality of gates are one of D flip-flops and J-K flip-flops.

20. A circuit coupled to a data bus, comprising:
   a first plurality of gates triggered in a synchronous manner;
   a second plurality of gates coupled to the first plurality of gates, the second plurality of gates being triggered in a phased manner with respect to one another, wherein the first plurality of gates holds data from the data bus, and wherein the output from the second plurality of gates is skewed so as to reduce noise in the output from the second plurality of gates.

* * * * *